US012772667B2

(12) United States Patent
Han et al.

(10) Patent No.: US 12,772,667 B2
(45) Date of Patent: Oct. 20, 2026

(54) DISPLAY APPARATUS

(71) Applicant: Samsung Display Co., Ltd., Yongin-si (KR)

(72) Inventors: Beomhee Han, Yongin-si (KR); Kangwoo Kim, Yongin-si (KR); Jaeseung Kim, Yongin-si (KR); Jungeun Park, Yongin-si (KR); Youngsik Oh, Yongin-si (KR); Sangbeom Han, Yongin-si (KR); Kipyo Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 593 days.

(21) Appl. No.: 18/356,531

(22) Filed: Jul. 21, 2023

(65) Prior Publication Data

US 2024/0121991 A1 Apr. 11, 2024

(30) Foreign Application Priority Data

Oct. 5, 2022 (KR) ........................ 10-2022-0127391

(51) Int. Cl.

| | |
|---|---|
| ***H10K 59/122*** | (2023.01) |
| ***H10K 59/38*** | (2023.01) |
| ***H10K 59/80*** | (2023.01) |

(52) U.S. Cl.

CPC ........... *H10K 59/122* (2023.02); *H10K 59/38* (2023.02); *H10K 59/873* (2023.02)

(58) Field of Classification Search

CPC .... H10K 59/122; H10K 59/38; H10K 59/873; H10K 2102/331; H10K 59/352; H10K 50/844; H10K 2102/351

See application file for complete search history.

(56) References Cited

U.S. PATENT DOCUMENTS

| | | | | |
|---|---|---|---|---|
| 2019/0172874 | A1* | 6/2019 | Lim | H10K 59/879 |
| 2021/0050388 | A1 | 2/2021 | Song | |
| 2021/0328168 | A1 | 10/2021 | Park et al. | |
| 2021/0391395 | A1* | 12/2021 | Shin | H10K 50/115 |
| 2022/0003909 | A1 | 1/2022 | Song et al. | |

(Continued)

FOREIGN PATENT DOCUMENTS

| | | |
|---|---|---|
| KR | 10-1949389 | 2/2019 |
| KR | 10-2021-0021216 A | 2/2021 |
| KR | 10-2021-0129786 | 10/2021 |

(Continued)

*Primary Examiner* — Kevin Quarterman

(74) *Attorney, Agent, or Firm* — Innovation Counsel LLP

(57) ABSTRACT

A display apparatus includes a light-emitting panel including a first substrate and a plurality of light-emitting devices disposed on the first substrate, and a color panel including a second substrate, a bank disposed on a lower surface of the second substrate in a direction to the first substrate and including a plurality of first openings each corresponding to emission areas of the plurality of light-emitting devices, a functional layer arranged in the plurality of first openings, a first protrusion pattern disposed on the bank, and a second protrusion pattern disposed on the bank. The first protrusion pattern is arranged between adjacent ones of the plurality of first openings, and the second protrusion pattern is spaced apart from the first protrusion pattern.

18 Claims, 12 Drawing Sheets

(56) References Cited

U.S. PATENT DOCUMENTS

| | | | |
|---|---|---|---|
| 2022/0158043 | A1 | 5/2022 | Lee et al. |
| 2022/0199690 | A1 | 6/2022 | Lee et al. |

FOREIGN PATENT DOCUMENTS

| | | | |
|---|---|---|---|
| KR | 10-2022-0004872 | | 1/2022 |
| KR | 10-2022-0065925 | | 5/2022 |
| KR | 10-2022-0088541 | A | 6/2022 |

* cited by examiner

DISPLAY APPARATUS

CROSS-REFERENCE TO RELATED APPLICATION(S)

This application claims priority to and benefits of Korean Patent Application No. 10-2022-0127391 under 35 U.S.C. § 119, filed on Oct. 5, 2022, in the Korean Intellectual Property Office (KIPO), the entire contents of which are incorporated herein by reference.

BACKGROUND

1. Technical Field

The disclosure relates to a display apparatus with improved display quality.

2. Description of the Related Art

Display apparatuses may include a color conversion device that receives light from a light source, for example, an organic light-emitting device, and implements color. The color conversion device may be arranged in the form of a separate substrate in a display apparatus, or may be directly integrated with devices within a display apparatus.

For example, the color conversion device may receive blue light from a light source and emit each of blue, green and red light, so that an image having various colors may be viewed. In this case, the green color and the red color may be implemented by converting the blue light, and the blue light may be implemented by emitting the blue light as it is or scattering the blue light to improve a viewing angle.

SUMMARY

The disclosure relates to a display apparatus including a color conversion device with improved display quality. However, the scope of the disclosure is not limited thereto.

Additional aspects will be set forth in part in the description which follows and, in part, will be apparent from the description, or may be learned by practice of the presented embodiments of the disclosure.

According to the disclosure, a display apparatus may include a light-emitting panel including a first substrate and a plurality of light-emitting devices disposed on the first substrate, and a color panel including a second substrate, a bank disposed on a lower surface of the second substrate in a direction to the first substrate and including a plurality of first openings each corresponding to emission areas of the plurality of light-emitting devices, a functional layer arranged in the plurality of first openings, a first protrusion pattern disposed on the bank, and a second protrusion pattern disposed on the bank. The first protrusion pattern may be arranged between adjacent ones of the plurality of first openings, and the second protrusion pattern may be spaced apart from the first protrusion pattern.

In an embodiment, a thickness of the first protrusion pattern may be less than a thickness of the second protrusion pattern in a thickness direction of the second substrate.

In an embodiment, a width of the first protrusion pattern may be less than a width of the second protrusion pattern in a direction that adjacent ones of the plurality of first openings are arranged.

In an embodiment, a width of the first protrusion pattern may be less than a width of the bank arranged between adjacent ones of the plurality of first openings in a direction that adjacent ones of the plurality of first openings are arranged.

In an embodiment, the bank may further include a plurality of second openings disposed adjacent to the plurality of first openings, and the plurality of second openings may not overlap the emission areas of the plurality of light-emitting devices in a plan view.

In an embodiment, the second protrusion pattern may be arranged between adjacent ones of the plurality of second openings.

In an embodiment, the second protrusion pattern and the bank may include a same material.

In an embodiment, the first protrusion pattern and the bank may include a same material.

In an embodiment, each of the first protrusion pattern and the second protrusion pattern may be integrally formed with the bank.

In an embodiment, a surface of the first protrusion pattern may have a curved shape in a cross-sectional view.

In an embodiment, the first protrusion pattern may include a plurality of first protrusion patterns arranged between adjacent ones of the plurality of first openings.

In an embodiment, the color panel may further include a capping layer disposed on the functional layer, the first protrusion pattern, and the second protrusion pattern.

In an embodiment, the color panel may further include a color filter layer arranged between the functional layer and the second substrate and including a first color filter, a second color filter, and a third color filter.

In an embodiment, the functional layer may include a first color conversion layer, a second color conversion layer, and a transmission layer, the first color conversion layer may include first quantum dots, and the second color conversion layer may include second quantum dots.

In an embodiment, the plurality of light-emitting devices may be organic light-emitting didoes emitting blue light.

According to the disclosure, a display apparatus may include a first substrate and a second substrate facing the first substrate, a light-emitting device disposed on the first substrate and including an emission area, a pixel-defining layer disposed on the first substrate and defining the emission area, an encapsulation layer covering the light-emitting device, a bank disposed above the encapsulation layer and having a plurality of openings corresponding to the emission area, a first protrusion pattern arranged between the bank and the encapsulation layer, a second protrusion pattern arranged between the bank and the encapsulation layer and having a thickness greater than a thickness of the first protrusion pattern in a thickness direction of the second substrate, a functional layer arranged in the plurality of openings, and a color filter layer arranged between the functional layer and the second substrate, and between the bank and the second substrate. The second protrusion pattern and the bank may include a same material.

In an embodiment, each of the first protrusion pattern and the second protrusion pattern may overlap the bank and the pixel-defining layer in a plan view.

In an embodiment, the bank and the second protrusion pattern may be integral with each other.

In an embodiment, the plurality of openings may include a plurality of first openings and a plurality of second openings, the functional layer may be arranged in the plurality of first openings, and the first protrusion pattern may be arranged between adjacent ones of the plurality of first openings.

In an embodiment, the first protrusion pattern may be spaced apart from the second protrusion pattern.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
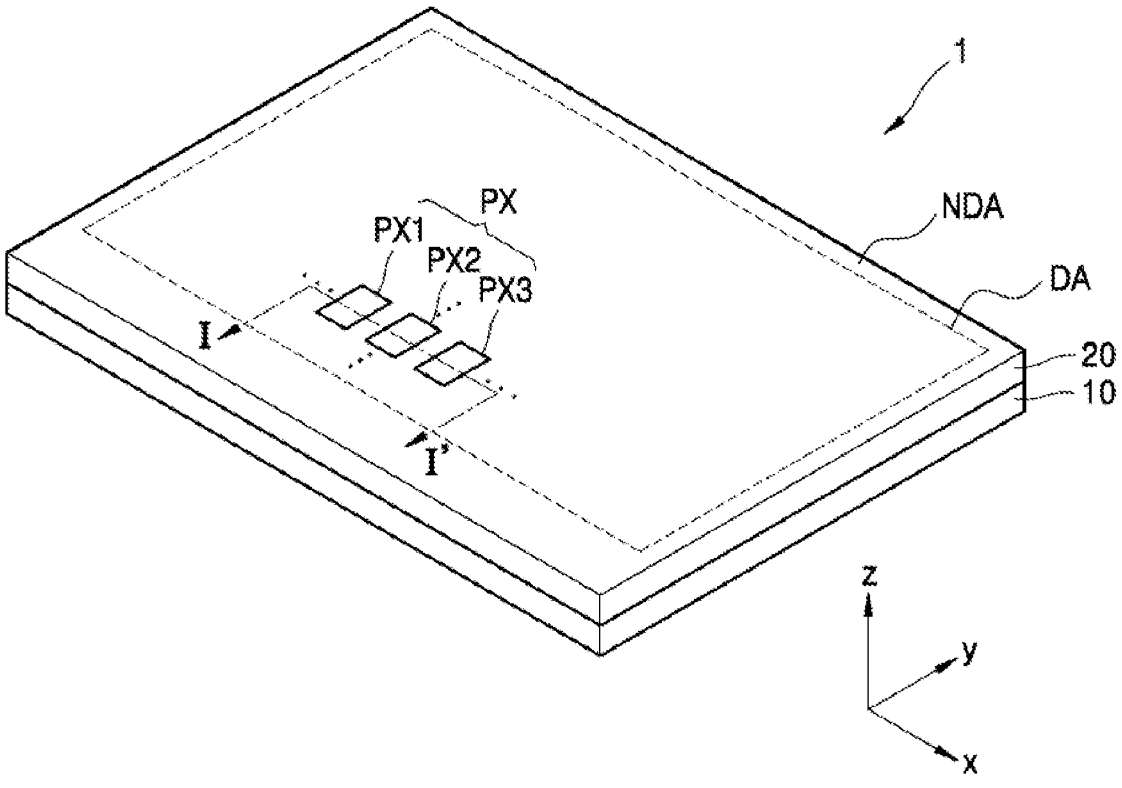
FIG. 1 is a schematic perspective view of a display apparatus according to an embodiment.

Reference will now be made in detail to embodiments, examples of which are illustrated in the accompanying drawings, wherein like reference numerals refer to like elements throughout the specification. In this regard, the embodiments may have different forms and should not be construed as being limited to the descriptions set forth herein. Accordingly, the embodiments are merely described below, by referring to the figures, to explain aspects of the description. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Various modifications may be applied to the embodiments, and particular embodiments of the disclosure will be illustrated in the drawings and described in the detailed description section. The effect and features of the embodiments, and a method to achieve the same, will be clearer referring to the detailed descriptions below with the drawings. However, the disclosure may be implemented in various forms, not by being limited to the embodiments presented below.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification, it will be understood that although the terms "first," "second," etc. may be used herein to describe various components, these components should not be limited by these terms. These terms are only used to distinguish one component from another.

In the specification, the expression of singularity in the specification includes the expression of plurality unless clearly specified otherwise in context.

In the specification, it will be further understood that the terms "comprises" and/or "comprising" used herein specify the presence of stated features or components, but do not preclude the presence or addition of one or more other features or components.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

In the specification, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the specification, when a certain embodiment may be implemented differently, a specific process order may be performed differently from the described order. For example, two consecutively described processes may be performed substantially at the same time or performed in an order opposite to the described order.

Sizes of components in the drawings may be exaggerated or reduced for convenience of explanation. In other words, since sizes and thicknesses of components in the drawings are arbitrarily illustrated for convenience of explanation, the following embodiments are not limited thereto.

Hereinafter, embodiments of the disclosure will be described in detail with reference to the accompanying drawings, and in the description with reference to the drawings, the same or corresponding components are indicated by the same reference numerals and redundant descriptions thereof are omitted.

Hereinafter, an organic light-emitting display apparatus is described as a display apparatus 1 according to an embodiment, but a display apparatus of the disclosure is not limited thereto. In an embodiment, the display apparatus 1 of the disclosure may be an inorganic light-emitting display (or inorganic electroluminescent (EL) display) or a quantum dot light-emitting display. For example, an emission layer of a display element included in the display apparatus 1 may include an organic material, an inorganic material, a quantum dot, an organic material and a quantum dot, or an inorganic material and a quantum dot.

Figure 2:
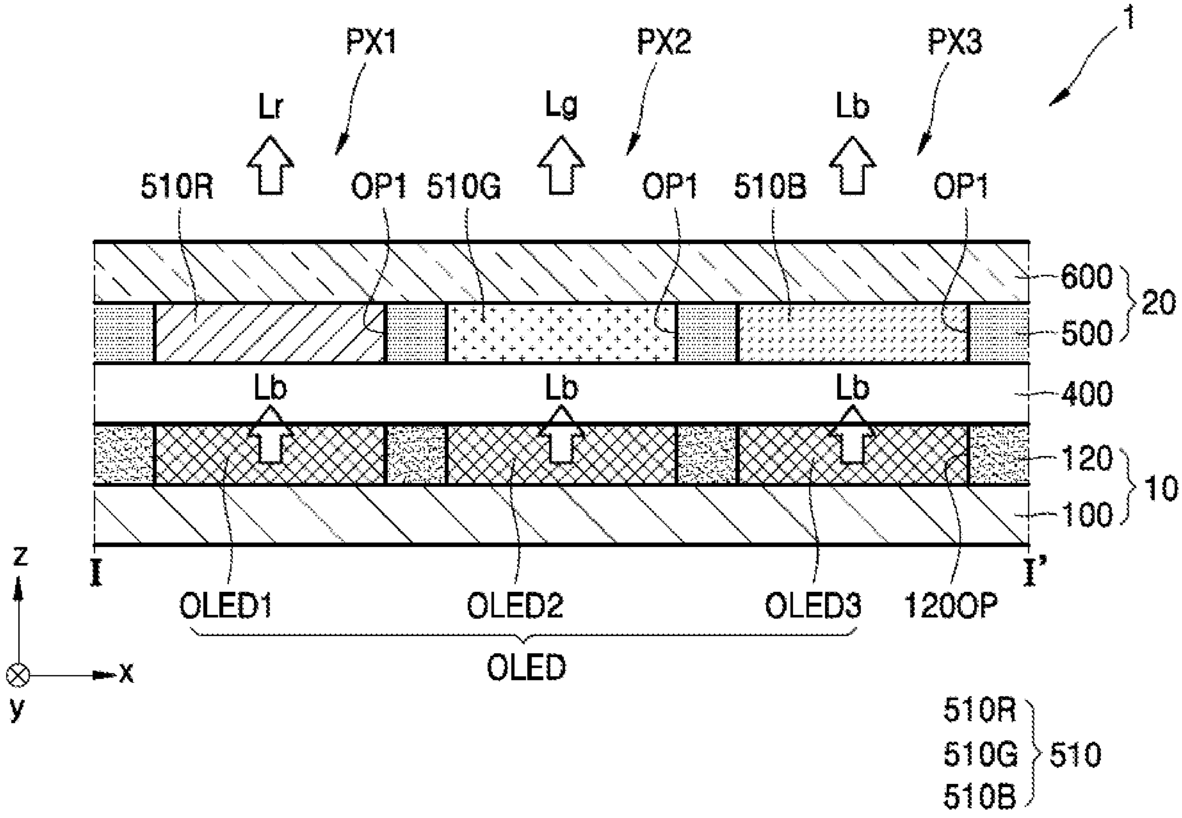
FIG. 2 is a schematic cross-sectional view of a display apparatus according to an embodiment.

FIG. 1 is a schematic perspective view of a display apparatus according to an embodiment. FIG. 2 is a schematic cross-sectional view of a display apparatus according to an embodiment. FIG. 2 is a schematic cross-sectional view of the display apparatus taken along line I-I' of FIG. 1.

Referring to FIGS. 1 and 2, the display apparatus 1 may include a display area DA and a non-display area NDA disposed adjacent to the display area DA. The display apparatus 1 may provide an image through an array of multiple pixels PX two-dimensionally arranged in the display area DA. The pixels PX may include a first pixel PX1, a second pixel PX2, and a third pixel PX3.

Each of the pixels PX of the display apparatus 1 may occupy an area from which light of a certain color may be emitted, and the display apparatus 1 may provide an image by using the light emitted from the pixels PX. For example, each pixel PX may emit red light, green light, or blue light.

The non-display area NDA may be an area where an image is not provided, and may entirely surround the display area DA. A driver or a main power line, each configured to provide an electrical signal or power to pixel circuits, may be arranged in the non-display area NDA. The non-display area NDA may include a pad to which an electronic device or a printed circuit board is electrically connected.

The display area DA may have a polygonal shape including a quadrangle in a plan view as shown in FIG. 1. For example, the display area DA may have a rectangular shape in which a horizontal length is greater than a vertical length, a rectangular shape in which a horizontal length is smaller than a vertical length, or a square shape in which a horizontal length and a vertical length are identical to each other. However, the disclosure is not limited thereto, and the display area DA may have various shapes, such as an ellipse or a circle.

In an embodiment, the display apparatus 1 may include a light-emitting panel 10 (or an emitting unit) and a color panel 20 (or a color unit), stacked in a thickness direction (for example, a z direction) of the display apparatus 1. Referring to FIG. 2, the light-emitting panel 10 may include a light-emitting device OLED disposed on a first substrate 100. For example, the light-emitting device OLED may include first to third light-emitting devices OLED1, OLED2, and OLED3. The first to third light-emitting devices OLED1, OLED2, and OLED3 may be organic light-emitting diodes. However, the disclosure is not limited thereto. The first to third light-emitting devices OLED1, OLED2, and OLED3 may be inorganic light-emitting diodes, or various modifications may be made.

Light (for example, blue light Lb) emitted from the first to third light-emitting devices OLED1, OLED2, and OLED3 may be converted into red light Lr, green light Lg, and blue light Lb through the color panel 20, or may pass through the color panel 20.

In an embodiment, a pixel-defining layer 120, which defines an emission area of each of the first to third light-emitting devices OLED1, OLED2, and OLED3, may be disposed on the first substrate 100. In other words, the pixel-defining layer 120 may include openings 1200P defining the emission area of each of the first to third light-emitting devices OLED1, OLED2, and OLED3.

In an embodiment, the pixel-defining layer 120 may include an organic insulating material, such as benzocyclobutene (BCB), polyimide, or hexamethyldisiloxane (HMDSO). In another embodiment, the pixel-defining layer 120 may include an inorganic insulating material, such as silicon nitride ($SiN_x$), silicon oxynitride ($SiO_xN_y$), or silicon oxide ($SiO_x$). In another embodiment, the pixel-defining layer 120 may include an organic insulating material and an inorganic insulating material. In an embodiment, the pixel-defining layer 120 may include a light-blocking material, and may be black. The light-blocking material may include resin or paste including carbon black, carbon nanotubes, black dye, metal particles (for example nickel, aluminum, molybdenum, and an alloy thereof), metal oxide particles (for example, chromium oxide), or metal nitride particles (for example, chromium nitride). In case that the pixel-defining layer 120 includes a light-blocking material, reflection of external light by metal structures disposed under the pixel-defining layer 120 may be reduced.

In an embodiment, a filler 400 may be arranged between the first substrate 100 and a second substrate 600. The filler 400 may act as a buffer against external pressure or the like. The filler 400 may include an organic material, such as methyl silicone, phenyl silicone, or polyimide. However, the disclosure is not limited thereto, and the filler 400 may include an inorganic sealant such as silicone, or an organic sealant such as an urethane-based resin, an epoxy-based resin, or an acrylic resin.

In an embodiment, a bank 500 may be disposed on the filler 400. The bank 500 may include various materials capable of absorbing light. The bank 500 and the pixel-defining layer 120 may include a same material or different materials. For example, the bank 500 may include an opaque inorganic insulating material such as chromium oxide or molybdenum oxide, or an opaque organic insulating material such as a black resin.

In an embodiment, the bank 500 may include multiple first openings OP1 corresponding to respective emission areas of the first to third light-emitting devices OLED1, OLED2, and OLED3. For example, the first openings OP1 defined in the bank 500 may correspond to the openings 1200P defined in the pixel-defining layer 120, respectively. In an embodiment, a functional layer 510 may be arranged in the first openings OP1 defined in the bank 500. The functional layer 510 may include a first color conversion layer 510R, a second color conversion layer 510G, and a transmission layer 510B. For example, the first color conversion layer 510R, the second color conversion layer 510G, and the transmission layer 510B may be arranged in the first openings OP1 defined in the bank 500, respectively.

Figure 3:
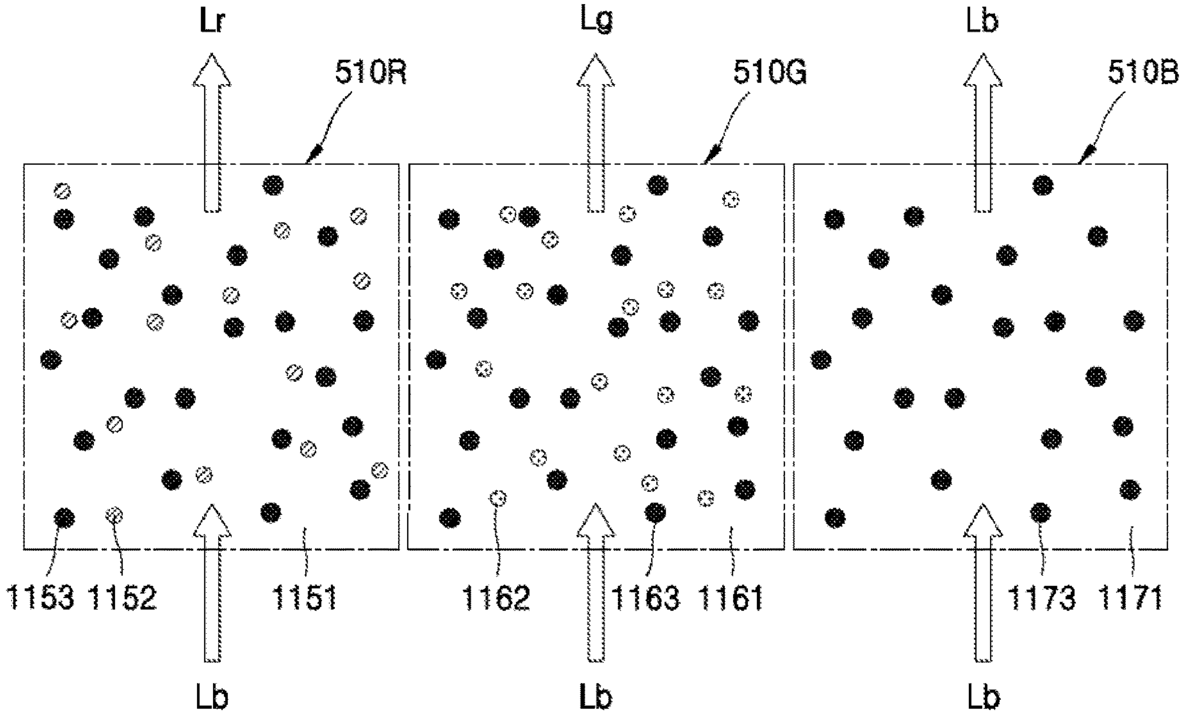
FIG. 3 is a schematic cross-sectional view of respective portions of a first color conversion layer, a second color conversion layer, and a transmission layer, of FIG. 2.

FIG. 3 is a schematic cross-sectional view of respective portions of the first color conversion layer 510R, the second color conversion layer 510G, and the transmission layer 510B of FIG. 2.

Referring to FIG. 3, the first color conversion layer 510R may convert the incident blue light Lb into the red light Lr. The first color conversion layer 510R may include a first photosensitive polymer 1151, first quantum dots 1152, and first scattering particles 1153, and the first quantum dots 1152 and the first scattering particles 1153 may be dispersed in the first photosensitive polymer 1151.

The first quantum dots 1152 may be excited by the blue light Lb, and may isotropically emit the red light Lr having a wavelength greater than a wavelength of the blue light Lb. The first photosensitive polymer 1151 may be an organic material having light transmittance. The first scattering particles 1153 may scatter the blue light Lb that is not absorbed by the first quantum dots 1152 so that more first quantum dots 1152 are excited, thereby increasing color conversion efficiency. The first scattering particles 1153 may be, for example, titanium oxide ($TiO_2$) or metal particles. The first quantum dots 1152 may be selected from a Group II-VI compound, a Group III-V compound, a Group IV-VI compound, a Group IV element, a Group IV compound, or a combination thereof.

For example, in the specification, a quantum dot (for example, the first quantum dots 1152 and second quantum dots 1162) may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, an metal organic chemical vapor deposition (MOCVD) process, a molecular-beam epitaxy (MBE) process, or a process similar thereto. The wet chemical process may be a method of growing a quantum dot particle crystal after mixing an organic solvent and a precursor material. In case that the crystal grows, the organic solvent may naturally act as a dispersant coordinated on the surface of the quantum dot crystal and controls the growth of the crystal so that the growth of quantum dot particles can be controlled through a process which costs lower and is easier than vapor deposition methods, such as MOCVD or MBE.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include a binary compound, such as CdS, CdSe, CdTe, ZnS, ZnSe, ZnTe, ZnO, HgS, HgSe, HgTe, MgSe, or MgS, a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound, such as CdZnSeS, CdZnSeTe, CdZnSTe, CdHgSeS, CdHgSeTe, CdHgSTe, HgZnSeS, HgZnSeTe, or HgZnSTe, or any combination thereof.

Examples of the Group III-V semiconductor compound may include a binary compound, such as GaN, GaP, GaAs, GaSb, AlN, AlP, AlAs, AlSb, InN, InP, InAs, or InSb, a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb, a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, or any combination thereof. The Group III-V semiconductor compound may further include Group II elements. Examples of the Group III-V semiconductor compound further including Group II elements may include InZnP, InGaZnP, or InAlZnP.

Examples of the Group III-VI semiconductor compound may include a binary compound, such as GaS, GaSe, $Ga_2Se_3$, GaTe, InS, $In_2S_3$, InSe, $In_2Se_3$, or InTe, a ternary compound, such as AgInS, $AgInS_2$, CuInS, $CuInS_2$, $InGaS_3$, or $InGaSe_3$, or any combination thereof.

Examples of the Group I-III-VI semiconductor compound may include a ternary compound, such as AgInS, $AgInS_2$, CuInS, $CuInS_2$, $CuGaO_2$, $AgGaO_2$, $AgAlO_2$, or any combination thereof.

Examples of the Group IV-VI semiconductor compound may include a binary compound, such as SnS, SnSe, SnTe, PbS, PbSe, or PbTe, a ternary compound, such as SnSeS, SnSeTe, SnSTe, PbSeS, PbSeTe, PbSTe, SnPbS, SnPbSe, or SnPbTe, a quaternary compound, such as SnPbSSe, SnPbSeTe, or SnPbSTe, or any combination thereof.

The Group IV element or compound may include a single element compound, such as Si or Ge, a binary compound, such as SiC or SiGe, or any combination thereof.

Each element included in a multi-element compound, such as the binary compound, the ternary compound, and the quaternary compound, may exist in a particle with a uniform concentration or non-uniform concentration.

The quantum dot may have a single structure in which the concentration of each element in the quantum dot is uniform, or a core-shell structure. For example, the material included in the core and the material included in the shell may be different from each other. The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient in which the concentration of the element presented in the shell decreases toward the center of the quantum dot.

Examples of the material for forming the shell of the quantum dot may include an oxide of metal or non-metal, a semiconductor compound, or a combination thereof. Examples of the oxide of metal or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, a ternary compound, such as $MgAl_2O_4$, $CoFe_2O_4$, $NiFe_2O_4$, or $CoMn_2O_4$, or any combination thereof. Examples of the semiconductor compound may include a Group II-VI semiconductor compound, a Group III-V semiconductor compound, a Group III-VI semiconductor compound, a Group I-III-VI semiconductor compound, a Group IV-VI semiconductor compound, or any combination thereof, as described above. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, the full width at half maximum of an emission wavelength spectrum of the quantum dot may be equal to or less than about 40 nm. For example, the full width at half maximum of an emission wavelength spectrum of the quantum dot may be less than or equal to about 30 nm. In case that the full width at half maximum of an emission wavelength spectrum of the quantum dot is within these ranges, color purity or color reproducibility may be increased. Light emitted through the quantum dot may be emitted in all directions, and thus, an optical viewing angle may be improved.

The quantum dot may be a spherical particle, a pyramidal particle, a multi-arm particle, a cubic nanoparticle, a nanotube particle, a nanowire particle, a nanofiber particle, or a nanoplate particle.

Since an energy band gap may be adjusted by controlling a size of the quantum dot, light having various wavelength bands may be obtained from a quantum dot emission layer. Therefore, by utilizing quantum dots of different sizes, a light-emitting device that emits light of various wavelengths may be implemented. For example, a size of the quantum dot may be selected to emit red light, green light, and/or blue light. A size of the quantum dot may be configured to emit white light by combining light of various colors.

The second color conversion layer 510G may convert the incident blue light Lb into the green light Lg. The second color conversion layer 510G may include a second photosensitive polymer 1161, second quantum dots 1162, and second scattering particles 1163, and the second quantum dots 1162 and the second scattering particles 1163 may be dispersed in the second photosensitive polymer 1161.

The second quantum dots 1162 may be excited by the blue light Lb, and may isotropically emit the green light Lg having a wavelength greater than a wavelength of the blue light Lb. The second photosensitive polymer 1161 may be an organic material having light transmittance.

The second scattering particles 1163 may scatter the blue light Lb that is not absorbed by the second quantum dots 1162 so that more second quantum dots 1162 are excited, thereby increasing color conversion efficiency. The second scattering particles 1163 may be, for example, titanium oxide ($TiO_2$) or metal particles. The second quantum dots 1162 may include a Group III-VI compound, a Group II-VI compound, a Group III-V compound, a Group III-VI compound, a Group I-III-VI compound, a Group IV-VI compound, a Group IV element or compound, or any combination thereof.

In some embodiments, the first quantum dots 1152 and the second quantum dots 1162 may be consist of a same material, and a size of the second quantum dots 1162 may be greater than a size of the first quantum dots 1152.

The transmission layer 510B may transmit the blue light Lb without converting the blue light Lb incident to the transmission layer 510B. The transmission layer 510B may include a third photosensitive polymer 1171 in which third scattering particles 1173 are dispersed. The third photosensitive polymer 1171 may be an organic material having light transmittance, such as a silicone resin or an epoxy resin, and the third photosensitive polymer 1171 and the first and second photosensitive polymers 1151 and 1161 may be consist of a same material. The third scattering particles 1173 may scatter and emit the blue light Lb, and the third scattering particles 1173 and the first and second scattering particles 1153 and 1163 may be consist of a same material.

Figure 4:
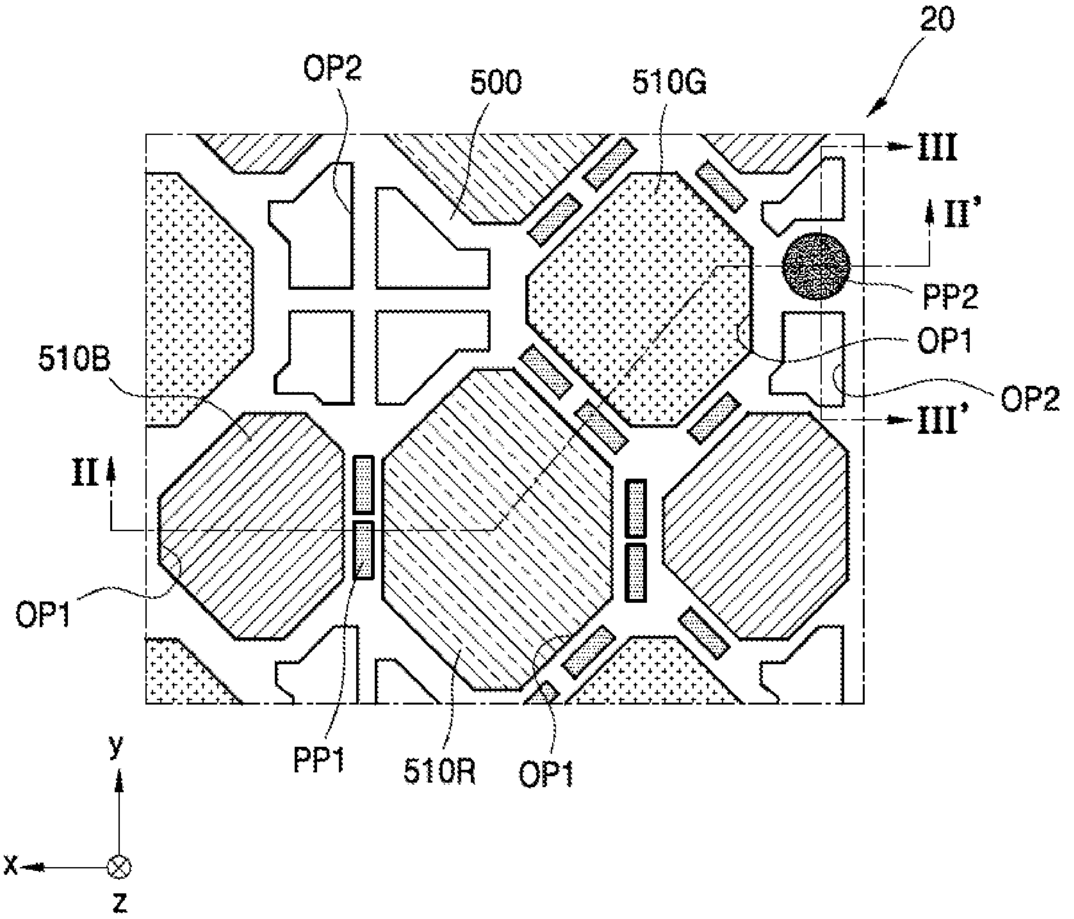
FIG. 4 is a schematic plan view of a color panel according to an embodiment.
Figure 5A:
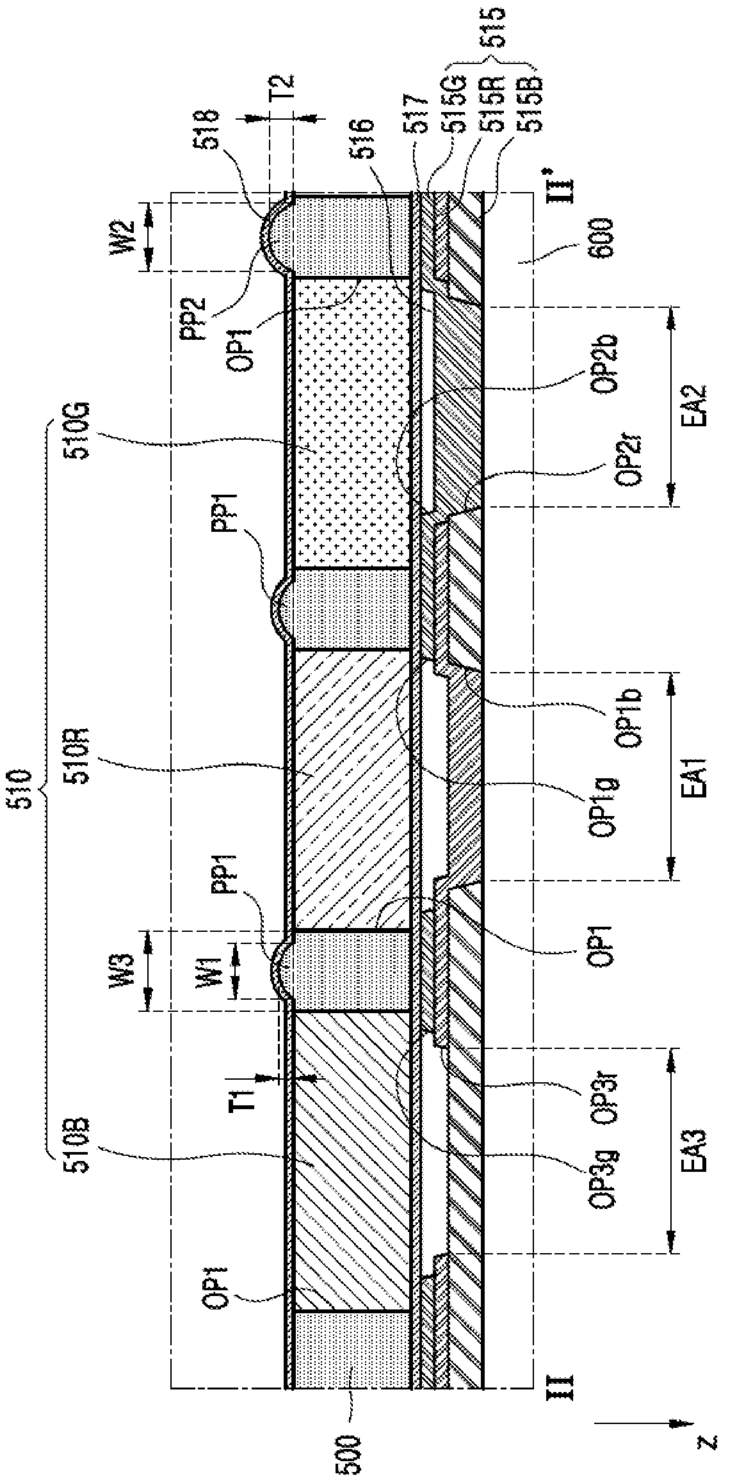
FIG. 5A is a schematic cross-sectional view of a color panel according to an embodiment.
Figure 5B:
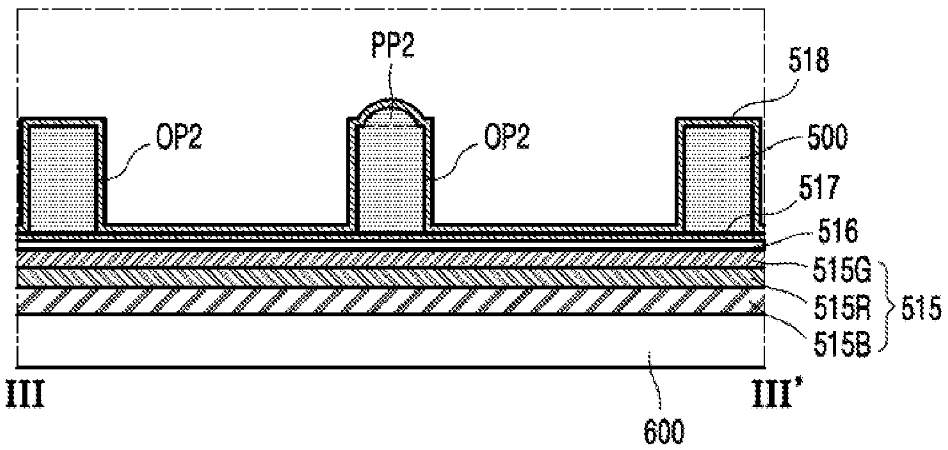
FIG. 5B is a schematic cross-sectional view of a color panel according to an embodiment.
Figure 5C:
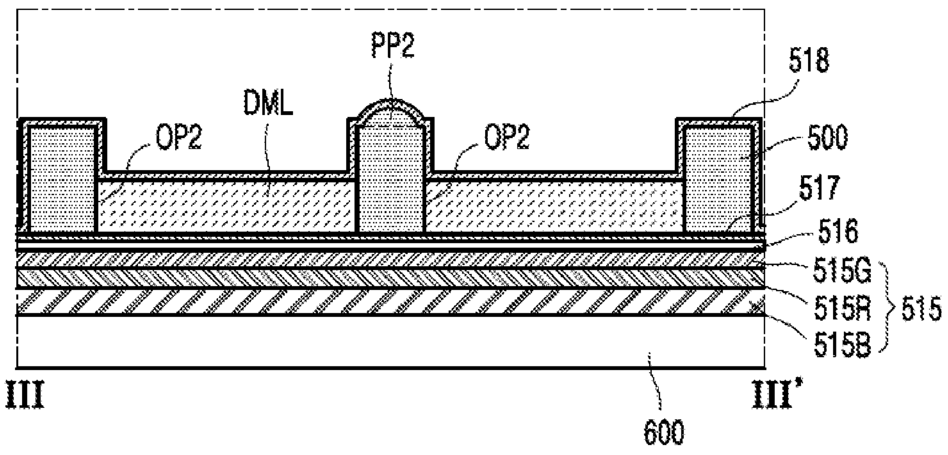
FIG. 5C is a schematic cross-sectional view of a color panel according to another embodiment.
Figure 6:
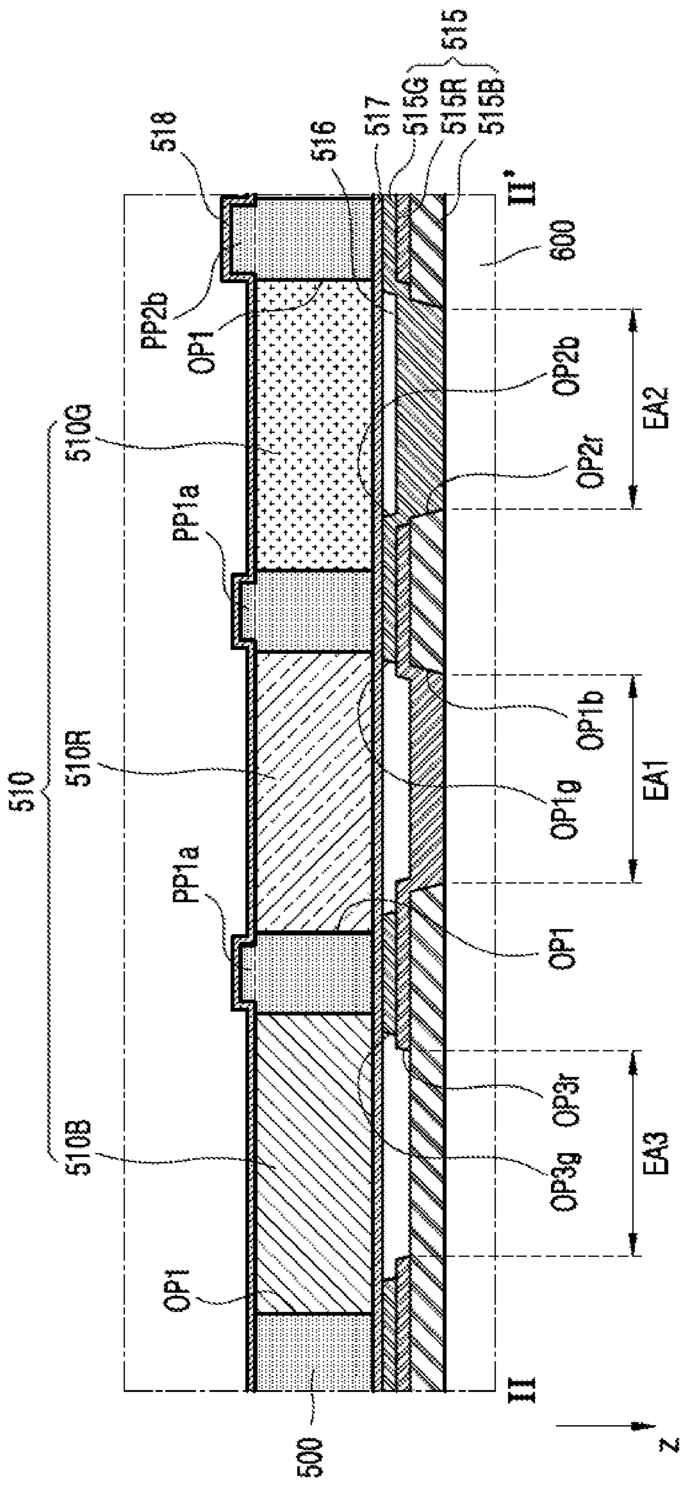
FIG. 6 is a schematic cross-sectional view of a color panel according to another embodiment.

FIG. 4 is a schematic plan view of the color panel 20 according to an embodiment. FIGS. 5A and 5B are schematic cross-sectional views of the color panel 20, according to an embodiment. FIG. 5A is a schematic cross-sectional view of the color panel 20 taken along line II-II' of FIG. 4. FIG. 5B is a schematic cross-sectional view of the color panel 20 taken along line III-III' of FIG. 4. FIG. 5C is a schematic cross-sectional view showing a region corresponding to the color panel 20 taken along line III-III' of FIG. 4 according to another embodiment. FIG. 6 is a schematic cross-sectional view showing a first protrusion pattern and a second protrusion pattern in an area corresponding to FIG. 5A according to another embodiment.

Referring to FIGS. 4, 5A and 5B, the color panel 20 may include the second substrate 600, a color filter layer 515 disposed on the second substrate 600, the functional layer 510, the bank 500 partitioning the first openings OP1 and multiple second openings OP2, and a first protrusion pattern PP1 and a second protrusion pattern PP2, disposed on the bank 500. The color panel 20 may further include a first capping layer 517 and a second capping layer 518.

Figure 10:
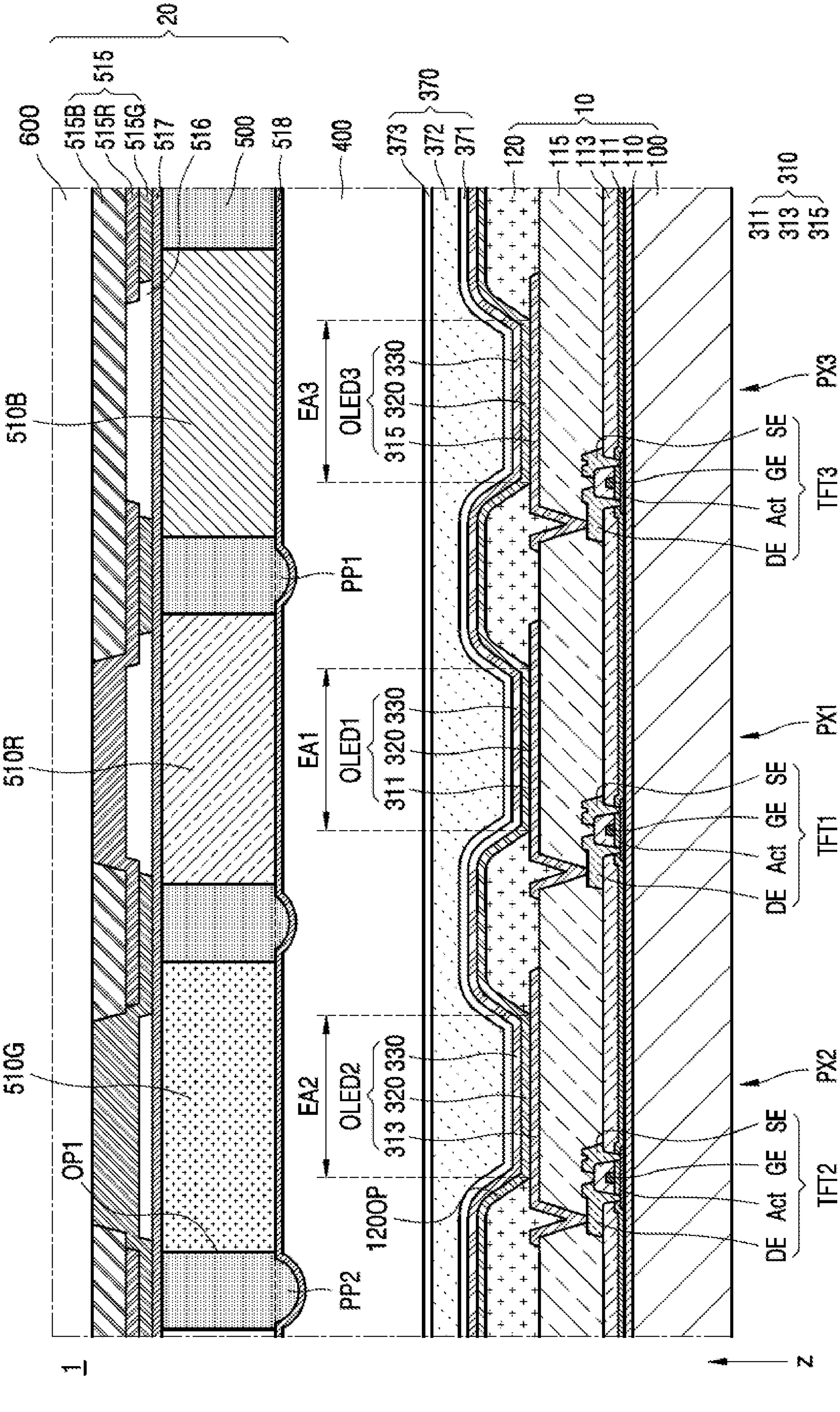
FIG. 10 is a schematic cross-sectional view of a display apparatus according to an embodiment.

FIGS. 5A and 5B illustrate a structure in which the second substrate 600 is disposed at the bottom, and the color filter layer 515, the functional layer 510, and the bank 500 are disposed on the second substrate 600. Substantially, in the display apparatus, the color panel 20 may be vertically inverted from the drawings of FIGS. 5A and 5B, and may be disposed on the light-emitting panel 10 as shown in FIG. 10.

The second substrate 600 may include a glass material or a polymer resin. In case that the second substrate 600 includes a polymer resin, the second substrate 600 may include polyethersulfone, polyacrylate, polyetherimide, polyethylene naphthalate, polyethylene terephthalate, polyphenylene sulfide, polyarylate, polyimide, polycarbonate, or cellulose acetate propionate.

The color filter layer 515 may include a first color filter 515R, a second color filter 515G, and a third color filter 515B, disposed on the second substrate 600. The first color filter 515R may improve color reproducibility of first color light Lr, the second color filter 515G may improve color reproducibility of second color light Lg, and the third color filter 515B may improve color reproducibility of third color light Lb.

The first color filter 515R may be a red color filter. For example, the first color filter 515R may pass only light having a wavelength in a range of about 630 nm to about 780 nm. The first color filter 515R may include a red pigment or dye. The second color filter 515G may be a green color filter. For example, the second color filter 515G may pass only light having a wavelength in a range of about 495 nm to about 570 nm. The second color filter 515G may include a green pigment or dye. The third color filter 515B may be a blue color filter. For example, the third color filter 515B may pass only light having a wavelength in a range of about 450 nm to about 495 nm. The third color filter 515B may include a blue pigment or dye.

The first color filter 515R, the second color filter 515G, and the third color filter 515B may overlap each other in a plan view. In an embodiment, the third color filter 515B may be disposed on the second substrate 600, the first color filter 515R may be disposed on the third color filter 515B, and the second color filter 515G may be disposed on the first color filter 515R. The arrangement order of the first color filter 515R to the third color filter 515B may be changed in another embodiment.

The first color filter 515R may be arranged to correspond to a first emission area EA1 of a first light-emitting device described with reference to FIG. 10 to improve, for example, color reproducibility of red light. Accordingly, the second color filter 515G and the third color filter 515B may include openings OP1*g* and OP1*b*, respectively, in the first emission area EA1. The second color filter 515G may be arranged to correspond to a second emission area EA2 of a second light-emitting device described with reference to FIG. 10 to improve, for example, color reproducibility of green light. Accordingly, the first color filter 515R and the third color filter 515B may include openings OP2*r* and OP2*b*, respectively, in the second emission area EA2. The third color filter 515B may be arranged to correspond to a third emission area EA3 of a third light-emitting device described with reference to FIG. 10 to improve, for example, color reproducibility of blue light. Accordingly, the first color filter 515R and the second color filter 515G may include openings OP3*r* and OP3*g*, respectively, in the third emission area EA3.

A refractive layer 516 may be disposed on the color filter layer 515. The refractive layer 516 may be arranged in an area corresponding to each of the first to third emission areas EA1, EA2, and EA3. The refractive layer 516 may include an organic material. In an embodiment, a refractive index of the refractive layer 516 may be less than a refractive index of the first capping layer 517. In an embodiment, a refractive index of the refractive layer 516 may be less than a refractive index of the color filter layer 515. Accordingly, the refractive layer 516 may concentrate light. In some embodiments, the refractive layer 516 may be omitted.

The first capping layer 517 may be disposed on the refractive layer 516 and the color filter layer 515. In an embodiment, the first capping layer 517 may be arranged between the color filter layer 515 and the functional layer 510. The first capping layer 517 may protect the refractive layer 516 and the color filter layer 515. The first capping layer 517 may prevent or reduce damage or contamination of the refractive layer 516 and/or the color filter layer 515 due to penetration of impurities, such as moisture and/or air, from the outside. The first capping layer 517 may include an inorganic material. In some embodiments, the first capping layer 517 may be omitted.

The bank 500 may be disposed on the color filter layer 515. The bank 500 may be disposed on the first capping layer 517.

The bank 500 may include the first opening OP1 and the second opening OP2. The first opening OP1 and the second opening OP2 may include multiple first openings OP1 and multiple second openings OP2, respectively. The first opening OP1 may be arranged to correspond to the first to third emission areas EA1, EA2, and EA3, as shown in FIGS. 4 and 5A. Light emitted through the first emission area EA1 to the third emission area EA3 may be emitted out of the second substrate 600 through the first opening OP1. The arrangement and/or shapes of the first opening OP1 and the second opening OP2 are not limited to that shown in FIG. 4, and various modifications may be made.

As shown in FIGS. 4 and 5B, the second opening OP2 may be arranged to correspond to an area other than the first to third emission areas EA1, EA2, and EA3, for example, a non-emission area. The second opening OP2 may not overlap the first to third emission areas EA1, EA2, and EA3 in a plan view. The second opening OP2 may be arranged in the vicinity of the first opening OP1 and adjacent to the first opening OP1.

As described above, the functional layer 510 may be arranged in the first opening OP1, and in a manufacturing process, in an embodiment, the functional layer 510 may be formed by an inkjet method. In an embodiment, an ink forming the functional layer 510 discharged into the first opening OP1 may overflow over the first opening OP1, or may be discharged to a portion other than the first opening OP1 due to misplacement of the ink. The second opening OP2 may be arranged adjacent to the first opening OP1 to reduce a defect caused by the misplacement of the ink. Therefore, it is illustrated that other components other than the second capping layer 518 are not arranged in the second opening OP2 of FIG. 5B. However, the disclosure is not limited thereto. For example, as shown in FIG. 5C, a dummy layer DML formed due to ink overflowing from the first opening OP1 may be further arranged. In the embodiment, the second capping layer 518 may be disposed on the dummy layer DML. The dummy layer DML may not overlap the first to third emission areas EA1, EA2, and EA3 in a plan view.

In an embodiment, a size of the second opening OP2 may be smaller than a size of the first opening OP1 in a plan view. The size of the first opening OP1 may correspond to a size of each light-emitting device, and the second opening OP2 may have a size smaller than the size of the first opening OP1.

The bank 500 may include an organic material. In an embodiment, the bank 500 may include a light-blocking material to function as a light-blocking layer. The light-blocking material may include, for example, at least one of a black pigment, a black dye, a black particle, and a metal particle.

As shown in FIGS. 4 and 5A, the first protrusion pattern PP1 may be arranged between adjacent first openings OP1. The first protrusion pattern PP1 may be arranged between adjacent functional layers 510. For example, the first protrusion pattern PP1 may be arranged between the first color conversion layer 510R and the second color conversion layer 510G. For example, the first protrusion pattern PP1 may be arranged between the first color conversion layer 510R and the transmission layer 510B. For example, the first protrusion pattern PP1 may be arranged between the second color conversion layer 510G and the transmission layer 510B. FIG. 4 illustrates that the first protrusion pattern PP1 has a rectangular shape in a plan view, but the disclosure is not limited thereto, and the first protrusion pattern PP1 may have various shapes, such as a polygonal, elliptical, or circular shape in a plan view. As shown in FIG. 4, multiple first protrusion patterns PP1 may be arranged between adjacent first openings OP1.

As shown in FIG. 5A, the first protrusion pattern PP1 may be disposed on the bank 500. The first protrusion pattern PP1 may be a pattern protruding from a surface of the bank 500. In an embodiment, a surface of the first protrusion pattern PP1 may have a curved shape in a cross-sectional view. A shape of the first protrusion pattern PP1 may be a droplet or hemispherical shape including a curved surface, but is not limited thereto, and the first protrusion pattern PP1 may have various shapes in a cross-sectional view. For example, as shown in FIG. 6, the first protrusion pattern PP1*a* may have a rectangular parallelepiped shape including a flat surface in a cross-sectional view. For example, the first protrusion pattern PP1*a* may have a shape having a step difference with the bank 500.

A vertical thickness T1 of the first protrusion pattern PP1 may be less than a vertical thickness T2 of the second protrusion pattern PP2. The vertical thickness T1 of the first protrusion pattern PP1 may be a thickness of a portion protruding from a surface of the bank 500 in a vertical direction. In case that a height of the bank 500 is small, ink discharged to each functional layer 510 may overflow. The first protrusion pattern PP1 may be disposed on the bank 500 and arranged between adjacent functional layers 510 to prevent discharged ink from overflowing. However, in case that the vertical thickness T1 of the first protrusion pattern PP1 is excessively high, light efficiency of the display apparatus may decrease. Thus, to prevent a decrease in light efficiency, the vertical thickness T1 of the first protrusion pattern PP1 may be formed to be less than the vertical thickness T2 of the second protrusion pattern PP2.

A width W1 of the first protrusion pattern PP1 may be less than a width W2 of the second protrusion pattern PP2 in a first direction in which adjacent first openings OP1 are arranged. In the first direction, the width W1 of the first protrusion pattern PP1 may be less than a width W3 of the bank 500 arranged between adjacent first openings OP1. In an embodiment, an area of the first protrusion pattern PP1 may be less than an area of the second protrusion pattern PP2 in a plan view.

In an embodiment, the first protrusion pattern PP1 and the bank 500 may be integral with each other. In an embodiment, the first protrusion pattern PP1 may be a portion of the bank 500. In an embodiment, the first protrusion pattern PP1 may be formed in a same process step for forming the bank 500. In an embodiment, the first protrusion pattern PP1 may be formed in a same process step for forming the second protrusion pattern PP2. In an embodiment, the bank 500 and the first protrusion pattern PP1, and the bank 500 and the second protrusion pattern PP2 may be integrally formed by a process using a 3-tone mask. The 3-tone mask process may be a process for implementing a difference between thicknesses of three different components. In an embodiment, the first protrusion pattern PP1 and the bank 500 may include a same material. In an embodiment, the first protrusion pattern PP1 and the second protrusion pattern PP2 may include a same material.

As shown in FIGS. 4 and 5B, the second protrusion pattern PP2 may be arranged between adjacent second openings OP2, but the disclosure is not limited thereto. The arrangement of the second protrusion pattern PP2 may vary. For example, the second protrusion pattern PP2 may be arranged between the second opening OP2 and the first opening OP1. In an embodiment, the second protrusion pattern PP2 may be arranged between dummy layers DML respectively arranged in the second openings OP2. FIG. 4 illustrates that the second protrusion pattern PP2 has a circular shape in a plan view, but the disclosure is not limited thereto, and the second protrusion pattern PP2 may have various shapes, such as an elliptical or polygonal shape in a plan view.

As shown in FIGS. 5A and 5B, the second protrusion pattern PP2 may be disposed on the bank 500. The second protrusion pattern PP2 may be a pattern protruding from a surface of the bank 500. In an embodiment, a surface of the second protrusion pattern PP2 may have a curved shape in a cross-sectional view. A shape of the second protrusion pattern PP2 may be a droplet or hemispherical shape including a curved surface in a cross-sectional view, but the disclosure is not limited thereto, and the second protrusion pattern PP2 may have various shapes. For example, as shown in FIG. 6, the second protrusion pattern PP2*b* may have a rectangular parallelepiped shape including a flat surface in a cross-sectional view. For example, the second protrusion pattern PP2*b* may have a shape having a step difference with the bank 500.

In an embodiment, the second protrusion pattern PP2 the bank 500 may be integral with each other. In an embodiment, the second protrusion pattern PP2 may be a portion of the bank 500. In an embodiment, the second protrusion pattern PP2 may be formed in a same process for forming the bank 500. In an embodiment, the second protrusion pattern PP2 and the bank 500 may include a same material.

The first protrusion pattern PP1 may be a pattern that prevents overflow of ink between the functional layers 510, and the second protrusion pattern PP2 may be a pattern that maintains a certain distance between a light-emitting panel 10 and a color panel 20 and supports bonding therebetween.

The second capping layer 518 may be disposed on the bank 500, the functional layer 510, the first protrusion pattern PP1, and the second protrusion pattern PP2. The second capping layer 518 may cover the bank 500, the functional layer 510, the first protrusion pattern PP1, and the second protrusion pattern PP2. The second capping layer 518 may protect the bank 500, the first protrusion pattern PP1, the second protrusion pattern PP2, and the functional layer 510. The second capping layer 518 may prevent or reduce damage or contamination of the bank 500, the first protrusion pattern PP1, the second protrusion pattern PP2, and/or the functional layer 510 due to penetration of impurities, such as moisture and/or air, from the outside.

Among the reference numerals indicated in the following description with reference to the drawings, the same reference numerals as the reference numerals indicated in FIGS. 4 to 5B denote the same or corresponding members, and thus, descriptions thereof are omitted for convenience of explanation.

Figure 7:
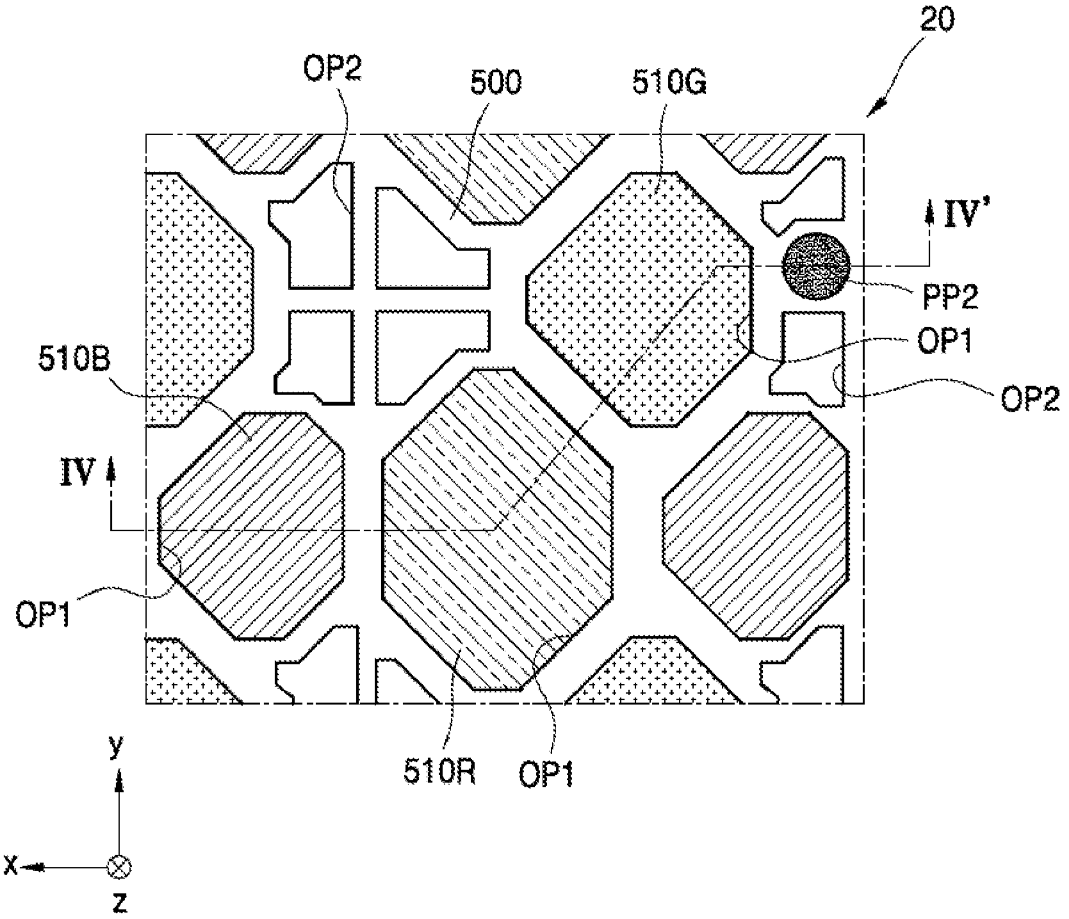
FIG. 7 is a schematic plan view of a color panel according to another embodiment.
Figure 8:
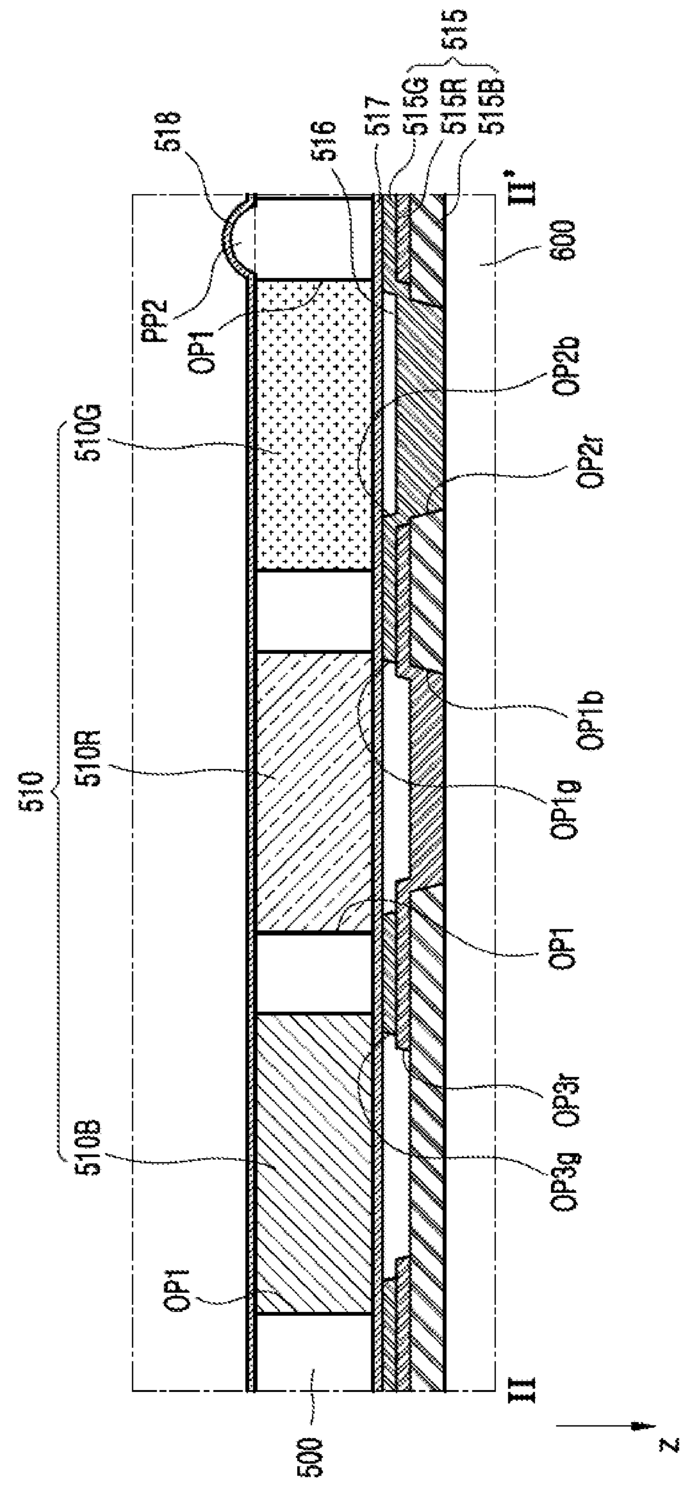
FIG. 8 is a schematic cross-sectional view of a color panel according to another embodiment.

FIG. 7 is a schematic plan view of the color panel 20 according to another embodiment. FIG. 8 is a schematic cross-sectional view of the color panel 20 according to another embodiment. FIG. 8 is a schematic cross-sectional view of the color panel 20 taken along line IV-IV' of FIG. 7.

Referring to FIGS. 7 and 8, the color panel 20 may include the second substrate 600, the color filter layer 515 disposed on the second substrate 600, the functional layer 510, the bank 500 partitioning the first openings OP1 and the second openings OP2, and the second protrusion pattern PP2 disposed on the bank 500. The color panel 20 may further include the first capping layer 517 and the second capping layer 518.

In an embodiment, the color panel 20 may not include the first protrusion pattern PP1. Heights of the banks 500 arranged between adjacent first openings OP1 may be substantially the same. For example, upper surfaces of the banks 500 arranged between adjacent first openings OP1 may be arranged at substantially the same height level.

In an embodiment, the second protrusion pattern PP2 the bank 500 may be integral with each other. In an embodiment, the second protrusion pattern PP2 may be a portion of the bank 500. The second protrusion pattern PP2 may be a pattern protruding from a surface of the bank 500 and may be a portion of the bank 500. In an embodiment, the second protrusion pattern PP2 may be formed in a same process for forming the bank 500. In an embodiment, the bank 500 and the second protrusion pattern PP2 may be integrally formed by a process using a half-tone mask. The half-tone mask process may be a process for implementing a difference between thicknesses of two different components, and the mask may be divided into a transmission area that transmits light, a semi-transmission area that partially transmits light, and a blocking area that blocks light transmission, according to light transmission rate. In an embodiment, the second protrusion pattern PP2 and the bank 500 may include a same material.

Figure 9:
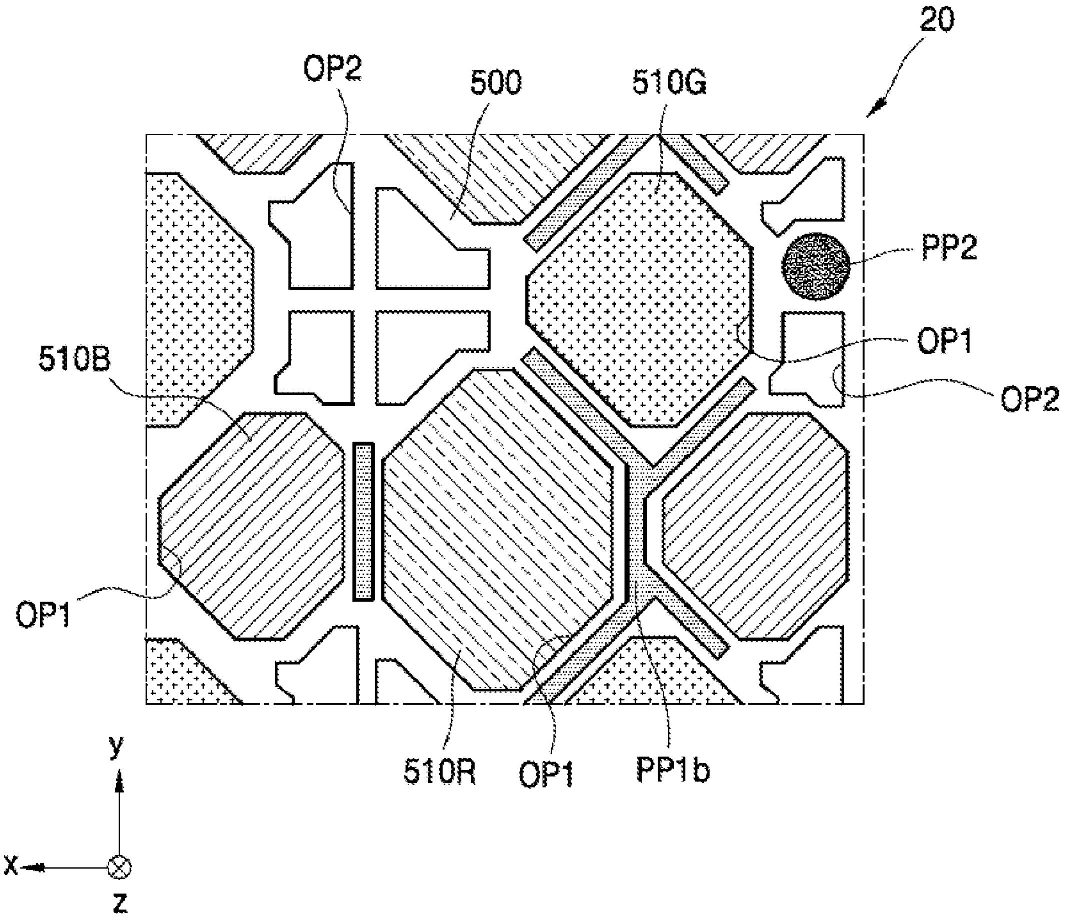
FIG. 9 is a schematic plan view of a color panel according to another embodiment.

FIG. 9 is a schematic plan view of a display apparatus according to another embodiment.

Referring to FIG. 9, a first protrusion pattern PP1*b* may be arranged between adjacent first openings OP1. The first protrusion pattern PP1*b* may be arranged between adjacent functional layers 510. In an embodiment, one first protrusion pattern PP1*b* may be arranged between adjacent first openings OP1. For example, one first protrusion pattern PP1*b* may be arranged between the first color conversion layer 510R and the second color conversion layer 510G, between the first color conversion layer 510R and the transmission layer 510B, and between the second color conversion layer 510G and the transmission layer 510B.

An area of the first protrusion pattern PP1*b* may be greater than an area of the second protrusion pattern PP2 in a plan view. Even in the embodiment, a vertical thickness of the first protrusion pattern PP1*b* may be less than a vertical thickness of the second protrusion pattern PP2. A width of the first protrusion pattern PP1*b* may be less than a width of the second protrusion pattern PP2 in a first direction in which adjacent first openings OP1 are arranged in a plan view.

FIG. 10 is a schematic cross-sectional view of a display apparatus according to an embodiment.

Referring to FIG. 10, the display apparatus 1 may include the light-emitting panel 10 and the color panel 20. The light-emitting panel 10 may include the first substrate 100, a buffer layer 110, first to third insulating layers 111, 113, and 115, first to third thin-film transistors TFT1, TFT2, and TFT3, the first to third light-emitting devices OLED1, OLED2, and OLED3, and the pixel-defining layer 120.

The buffer layer 110 may be disposed on the first substrate 100. The first substrate 100 may include glass, a metal, or a polymer resin as described above. The buffer layer 110 may include an inorganic material, such as silicon oxide, silicon nitride, and/or silicon oxynitride. The buffer layer 110 may be disposed on the first substrate 100 to increase flatness of an upper surface of the first substrate 100 or to prevent or reduce penetration of impurities from under the first substrate 100 to the first to third thin-film transistors TFT1, TFT2, and TFT3.

In an embodiment, the first light-emitting device OLED1 including a first pixel electrode 311, the second light-emitting device OLED2 including a second pixel electrode 313, and the third light-emitting device OLED3 including a third pixel electrode 315 may be disposed on the first substrate 100. The first thin-film transistor TFT1, the second thin-film transistor TFT2, and the third thin-film transistor TFT3 may be disposed on the first substrate 100.

The first thin-film transistor TFT1 may be electrically connected to the first light-emitting device OLED1, the second thin-film transistor TFT2 may be electrically connected to the second light-emitting device OLED2, and the third thin-film transistor TFT3 may be electrically connected to the third light-emitting device OLED3.

Hereinafter, the first thin-film transistor TFT1 and the first light-emitting device OLED1 are described. The second thin-film transistor TFT2 and the third thin-film transistor TFT3 may be provided similar to the first thin-film transistor TFT1, and the second light-emitting device OLED2 and the third light-emitting device OLED3 may be provided similar to the first light-emitting device OLED1.

The first to third thin-film transistors TFT1, TFT2, and TFT3 may be disposed on the buffer layer 110. The first thin-film transistor TFT1 may include a semiconductor layer Act, a gate electrode GE, a source electrode SE, and a drain electrode DE.

The semiconductor layer Act may include polysilicon. In another embodiment, the semiconductor layer Act may include amorphous silicon, an oxide semiconductor, an organic semiconductor, or the like. The semiconductor layer Act may include a channel region, and a drain region and a source region respectively at each side of the channel region.

The first insulating layer 111 may be disposed on the semiconductor layer Act. The first insulating layer 111 may include at least one of silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_X$). Zinc oxide ($ZnO_X$) may be zinc oxide (ZnO) and/or zinc peroxide ($ZnO_2$).

The gate electrode GE may be disposed on the first insulating layer 111. The gate electrode GE may overlap the channel region in a plan view. The gate electrode GE may include a low-resistance metal. The gate electrode GE may include a conductive material such as molybdenum (Mo), aluminum (Al), copper (Cu), titanium (Ti), and the like, and may be a multilayer or single layer including the above material.

The second insulating layer 113 may be disposed on the gate electrode GE. The second insulating layer 113 may include at least one of silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_X$). Zinc oxide ($ZnO_X$) may be zinc oxide (ZnO) and/or zinc peroxide ($ZnO_2$).

The source electrode SE and the drain electrode DE may be disposed on the second insulating layer 113. The source electrode SE and the drain electrode DE may include a material having excellent conductivity. The source electrode SE and the drain electrode DE may include a conductive material such as molybdenum (Mo), aluminum (Al), copper (Cu), titanium (Ti), and the like, and may be a multilayer or single layer including the above material. For example, the source electrode SE and the drain electrode DE may have a multilayer structure of Ti/Al/Ti.

The third insulating layer 115 may be disposed on the source electrode SE and the drain electrode DE. The third insulating layer 115 may include an organic insulating material. For example, the third insulating layer 115 may include an organic insulating material, such as a general purpose polymer, such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The first light-emitting device OLED1, the second light-emitting device OLED2, and the third light-emitting device OLED3 may be disposed on the third insulating layer 115 of the first substrate 100. FIG. 10 illustrates that organic light-emitting devices as the first to third light-emitting devices OLED1, OLED2, and OLED3 are disposed on the third insulating layer 115. The first light-emitting device OLED1 may be arranged in the first pixel PX1, the second light-emitting device OLED2 may be arranged in the second pixel PX2, and the third light-emitting device OLED3 may be arranged in the third pixel PX3.

The first light-emitting device OLED1 may include the first pixel electrode 311, an opposite electrode 330, and an intermediate layer 320 arranged between the first pixel electrode 311 and the opposite electrode 330. The second light-emitting device OLED2 may include the second pixel electrode 313, the opposite electrode 330, and the intermediate layer 320 arranged between the second pixel electrode 313 and the opposite electrode 330. The third light-emitting device OLED3 may include the third pixel electrode 315, the opposite electrode 330, and the intermediate layer 320 arranged between the third pixel electrode 315 and the opposite electrode 330. The intermediate layer 320 may include multiple emission layers.

The pixel-defining layer 120 may be disposed above the third insulating layer 115. The pixel-defining layer 120 may define a pixel by having an opening 1200P corresponding to each of the pixels, for example, the opening 1200P through which at least a portion of the first pixel electrode 311 is exposed. For example, the first light-emitting device OLED1 may have the first emission area EA1, and the first emission area EA1 of the first light-emitting device OLED1 may be defined by the opening 1200P of the pixel-defining layer 120. The first emission area EA1 may correspond to an emission area of light emitted from the first light-emitting device OLED1.

The pixel-defining layer 120 may define a pixel by having the opening 1200P through which at least a portion of the second pixel electrode 313 is exposed. For example, the second light-emitting device OLED2 may have the second emission area EA2, and the second emission area EA2 of the second light-emitting device OLED2 may be defined by the opening 1200P of the pixel-defining layer 120. The second emission area EA2 may correspond to an emission area of light emitted from the second light-emitting device OLED2.

The pixel-defining layer 120 may define a pixel by having the opening 1200P through which at least a portion of the third pixel electrode 315 is exposed. For example, the third light-emitting device OLED3 may have the third emission area EA3, and the third emission area EA3 of the third light-emitting device OLED3 may be defined by the opening 1200P of the pixel-defining layer 120. The third emission area EA3 may correspond to an emission area of light emitted from the third light-emitting device OLED3.

The pixel-defining layer 120 may prevent arcs or the like from occurring at edges of the first pixel electrode 311 to the third pixel electrode 315 by increasing a distance between the edge of the first pixel electrode 311 and the opposite electrode 330, a distance between the edge of the second pixel electrode 313 and the opposite electrode 330, and a distance between the edge of the third pixel electrode 315 and the opposite electrode 330.

The first pixel electrode 311 may be electrically connected to the first thin-film transistor TFT1 through a contact hole defined in the third insulating layer 115 or the like, the second pixel electrode 313 may be electrically connected to the second thin-film transistor TFT2 through a contact hole defined in the third insulating layer 115 or the like, and the third pixel electrode 315 may be electrically connected to the third thin-film transistor TFT3 through a contact hole defined in the third insulating layer 115 or the like.

The first pixel electrode 311 may include a light-transmissive conductive layer including a light-transmissive conductive oxide, such as ITO, $In_2O_3$, or IZO, and a reflective layer including a metal, such as Al or Ag. For example, the first pixel electrode 311 may have a three-layered structure of ITO/Ag/ITO. The second pixel electrode 313 and the third pixel electrode 315 and the first pixel electrode 311 may include a same material.

The intermediate layer 320 may be disposed on the first pixel electrode 311, the second pixel electrode 313, and the third pixel electrode 315. As shown in FIG. 10, the intermediate layer 320 may be integrally formed over the first pixel electrode 311, the second pixel electrode 313, and the third pixel electrode 315. However, the disclosure is not limited thereto. The intermediate layer 320 may be patterned to correspond to each of the first to third pixel electrodes 311, 313, and 315.

The opposite electrode 330 may be disposed on the intermediate layer 320. The opposite electrode 330 may also be integrally formed over the first pixel electrode 311, the second pixel electrode 313, and the third pixel electrode 315. The opposite electrode 330 may include a conductive material having a low work function. For example, the opposite electrode 330 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or an alloy thereof. For example, the opposite electrode 330 may include AgMg or AgYb. In another embodiment, the opposite electrode 330 may further include a layer including ITO, IZO, ZnO, or $In_2O_3$ on the (semi)transparent layer including the aforementioned material.

A pixel electrode 310 may be patterned to correspond to each pixel, and the intermediate layer 320 and the opposite electrode 330 may be integrally formed over each pixel.

The organic light-emitting devices may be damaged by moisture or oxygen from the outside, and thus, as necessary, an encapsulation layer 370 may cover the organic light-emitting devices to protect the organic light-emitting device. The encapsulation layer 370 may be provided as a thin-film encapsulation layer including at least one inorganic film layer and at least one organic film layer. In an embodiment, as shown in FIG. 10, the thin-film encapsulation layer may include a first inorganic film layer 371, an organic film layer 372, and a second inorganic film layer 373, sequentially stacked.

The first inorganic film layer 371 may be directly disposed on the opposite electrode 330. The first inorganic film layer 371 may prevent or reduce penetration of external moisture or air to the first light-emitting device OLED1 to the third light-emitting device OLED3.

The organic film layer 372 may be directly disposed on the first inorganic film layer 371. The organic film layer 372 may provide a flat surface on the first inorganic film layer 371. A curve or particle formed on an upper surface of the first inorganic film layer 371 may be covered by the organic film layer 372, and thus, an influence of a surface state of the upper surface of the first inorganic film layer 371 on components formed on the organic film layer 372 may be blocked.

The second inorganic film layer 373 may be directly disposed on the organic film layer 372. The second inorganic film layer 373 may prevent or reduce emission of moisture emitted from the organic film layer 372 to the outside.

The first inorganic film layer 371 and the second inorganic film layer 373 may include at least one inorganic material such as aluminum oxide, titanium oxide, tantalum oxide, hafnium oxide, zinc oxide, silicon oxide, silicon nitride, and silicon oxynitride. Each of the first inorganic film layer 371 and the second inorganic film layer 373 may be a single layer or multilayer including the aforementioned material. The organic film layer 372 may include a polymer-based material. The polymer-based material may include at least one of an acrylic resin, an epoxy-based resin, polyimide, and polyethylene. In an embodiment, the organic film layer 372 may include acrylate.

The bank 500 may be disposed on the first light-emitting device OLED1, the second light-emitting device OLED2, and the third light-emitting device OLED3. The bank 500 may include various materials capable of absorbing light. The bank 500 and the pixel-defining layer 120 may include a same material. However, the disclosure is not limited thereto. For example, the bank 500 and the pixel-defining layer 120 may include different materials. For example, the bank 500 may include an opaque inorganic insulating material such as chromium oxide or molybdenum oxide, or an opaque organic insulating material such as black resin.

As described above, the first opening OP1 and the second opening OP2 (see FIG. 4) may be defined in the bank 500. The first opening OP1 defined in the bank 500 may correspond to each of the first to third emission areas EA1, EA2, and EA3 of the first to third light-emitting devices OLED1, OLED2, and OLED 3.

In an embodiment, an area of the first opening OP1 defined in the bank 500 may be greater than an area of the opening 1200P of the pixel-defining layer 120 defining the first to third emission areas EA1, EA2, and EA3 in a plan view. However, the disclosure is not limited thereto, and an area of the first opening OP1 defined in the bank 500 may be equal to or less than an area of the opening 1200P of the pixel-defining layer 120 defining the first to third emission areas EA1, EA2, and EA3.

In an embodiment, the first color conversion layer 510R, the second color conversion layer 510G, and the transmission layer 510B may be arranged in the first opening OP1 defined in the bank 500.

The first color conversion layer 510R may at least partially overlap the first pixel electrode 311 of the first light-emitting device OLED1 in a plan view. The second color conversion layer 510G may at least partially overlap the second pixel electrode 313 of the second light-emitting device OLED2 in a plan view. The transmission layer 510B may at least partially overlap the third pixel electrode 315 of the third light-emitting device OLED3 in a plan view.

However, the second opening OP2 (see FIG. 4) defined in the bank 500 may not overlap the opening 1200P defined in the pixel-defining layer 120 in a plan view. In other words, the opening 1200P defined in the pixel-defining layer 120 may not be disposed directly under the second opening OP2.

The first color filter 515R may be disposed on the first color conversion layer 510R. The first pixel electrode 311 of the first light-emitting device OLED1, the first color conversion layer 510R, and the first color filter 515R may overlap each other in a thickness direction (z direction) of the first substrate 100.

The first light-emitting device OLED1 may emit light of a wavelength in a first wavelength band (for example, in a range of about 450 nm to about 495 nm), the first color conversion layer 510R may convert light of a wavelength in the first wavelength band into light of a wavelength in a second wavelength band (for example, in a range of about 630 nm to about 780 nm), and the first color filter 515R may pass light of a wavelength in the second wavelength band. The light of the first wavelength band emitted from the first light-emitting device OLED1 may be converted into light of a wavelength in the second wavelength band by the first color conversion layer 510R and may be filtered through the first color filter 515R. Therefore, the light of the wavelength in the second wavelength band may be emitted from the first pixel PX1. In other words, red light may be emitted from the first pixel PX1. Since light emitted from the first light-emitting device OLED1 passes through the first color conversion layer 510R and the first color filter 515R, color purity of light emitted through the second substrate 600 may be improved. For example, since light that is emitted from the first light-emitting device OLED1 but is not converted by the first color conversion layer 510R may be filtered through the first color filter 515R, color purity of light emitted through the second substrate 600 may be improved. The first color filter 515R may absorb external light, and thus, reflection of external light may be reduced.

The second color filter 515G may be disposed on the second color conversion layer 510G. The second pixel electrode 313 of the second light-emitting device OLED2, the second color conversion layer 510G, and the second color filter 515G may overlap each other in the thickness direction (z direction) of the first substrate 100. The second light-emitting device OLED2 may emit light of a wavelength in the first wavelength band, the second color conversion layer 510G may convert light of a wavelength in the first wavelength band into light of a wavelength in a third wavelength band (for example, in a range of about 495 nm to about 570 nm), and the second color filter 515G may pass light of a wavelength in the third wavelength band. The light of the first wavelength band emitted from the second light-emitting device OLED2 may be converted into light of a wavelength in the third wavelength band by the second color conversion layer 510G and may be filtered through the second color filter 515G. Therefore, the light of the wavelength om the third wavelength band may be emitted from the second pixel PX2. In other words, green light may be emitted from the second pixel PX2. Since light emitted from the second light-emitting device OLED2 passes through the second color conversion layer 510G and the second color filter 515G, color purity of light emitted through the second substrate 600 may be improved. For example, light that is emitted from the second light-emitting device OLED2 but is not converted by the second color conversion layer 510G may be filtered through the second color filter 515G, color purity of light emitted through the second substrate 600 may be improved. The second color filter 515G may absorb external light, and thus, reflection of external light may be reduced.

The third color filter 515B may be disposed on the transmission layer 510B. The third pixel electrode 315 of the third light-emitting device OLED3, the transmission layer 510B, and the third color filter 515B may overlap each other in the thickness direction (z direction) of the first substrate 100. The third light-emitting device OLED3 may emit light of a wavelength in the first wavelength band, and the transmission layer 510B and the third color filter 515B may pass light of a wavelength in the first wavelength band. The light of the first wavelength band emitted from the third light-emitting device OLED3 may pass through the transmission layer 510B and may be filtered through the third color filter 515B. Therefore, the light of the wavelength in the first wavelength band may be emitted from the third pixel PX3. In other words, blue light may be emitted from the third pixel PX3. Since light emitted from the third light-emitting device OLED3 passes through the transmission layer 510B and the third color filter 515B, color purity of light emitted through the second substrate 600 may be improved. The third color filter 515B may absorb external light, and thus, reflection of external light may be reduced.

In an embodiment, at least two color filter layers may overlap each other in a plan view between the first pixel PX1, the second pixel PX2, and the third pixel PX3. FIG. 10 illustrates that the first color filter 515R, the second color filter 515G, and the third color filter 515B are disposed between the first pixel PX1, the second pixel PX2, and the third pixel PX3. Color filter layers overlapping each other may act as a black matrix.

The second substrate 600 may be disposed on the first color filter 515R, the second color filter 515G, and the third color filter 515B. The first color filter 515R, the second color filter 515G, and the third color filter 515B may overlap each other between the second substrate 600 and the bank 500. Since the first color filter 515R, the second color filter 515G, and the third color filter 515B overlap each other between the second substrate 600 and the bank 500, a distance between the second substrate 600 and the bank 500 may be maintained constant.

In an embodiment, the filler 400 may be arranged between the light-emitting panel 10 and the color panel 20. The filler 400 may be a layer for connecting the light-emitting panel 10 and the color panel 20 together. The filler 400 may act as a buffer against external pressure or the like.

In an embodiment, the first protrusion pattern PP1 and the second protrusion pattern PP2 may be arranged between the first substrate 100 and the second substrate 600. The first protrusion pattern PP1 and the second protrusion pattern PP2 may be arranged between the bank 500 and the filler 400. The first protrusion pattern PP1 and the second protrusion pattern PP2 may be arranged between the bank 500 and the encapsulation layer 370.

Since the second protrusion pattern PP2 is arranged between the first substrate 100 and the second substrate 600, a distance between the first substrate 100 and the second substrate 600 may be maintained constant. The first protrusion pattern PP1 and the second protrusion pattern PP2 may overlap the bank 500 and the pixel-defining layer 120.

According to an embodiment, a display apparatus with improved display quality may be implemented. However, the scope of the disclosure is not limited thereto.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:
- a light-emitting panel comprising a first substrate and a plurality of light-emitting devices disposed on the first substrate; and
- a color panel comprising:
  - a second substrate,
  - a bank disposed on a lower surface of the second substrate in a direction to the first substrate and comprising a plurality of first openings each corresponding to emission areas of the plurality of light-emitting devices,
  - a functional layer arranged in the plurality of first openings,
  - a first protrusion pattern disposed on the bank, and
  - a second protrusion pattern disposed on the bank; wherein
- the first protrusion pattern is arranged between adjacent ones of the plurality of first openings, and
- the second protrusion pattern is spaced apart from the first protrusion pattern,
- wherein the bank further comprises a plurality of second openings disposed adjacent to the plurality of first openings, and
- the plurality of second openings do not overlap the emission areas of the plurality of light-emitting devices in a plan view.

2. The display apparatus of claim 1, wherein a thickness of the first protrusion pattern is less than a thickness of the second protrusion pattern in a thickness direction of the second substrate.

3. The display apparatus of claim 1, wherein a width of the first protrusion pattern is less than a width of the second protrusion pattern in a direction that adjacent ones of the plurality of first openings are arranged.

4. The display apparatus of claim 1, wherein a width of the first protrusion pattern is less than a width of the bank arranged between adjacent ones of the plurality of first openings in a direction that adjacent ones of the plurality of first openings are arranged.

5. The display apparatus of claim 1, wherein the second protrusion pattern is arranged between adjacent ones of the plurality of second openings.

6. The display apparatus of claim 1, wherein the second protrusion pattern and the bank comprise a same material.

7. The display apparatus of claim 1, wherein the first protrusion pattern and the bank comprise a same material.

8. The display apparatus of claim 1, wherein each of the first protrusion pattern and the second protrusion pattern are integrally formed with the bank.

9. The display apparatus of claim 1, wherein a surface of the first protrusion pattern has a curved shape in a cross-sectional view.

10. The display apparatus of claim 1, wherein the first protrusion pattern comprises a plurality of first protrusion patterns arranged between adjacent ones of the plurality of first openings.

11. The display apparatus of claim 1, wherein the color panel further comprises a capping layer disposed on the functional layer, the first protrusion pattern, and the second protrusion pattern.

12. The display apparatus of claim 1, wherein the color panel further comprises a color filter layer arranged between the functional layer and the second substrate and comprising a first color filter, a second color filter, and a third color filter.

13. The display apparatus of claim 1, wherein
- the functional layer comprises a first color conversion layer, a second color conversion layer, and a transmission layer,
- the first color conversion layer comprises first quantum dots, and
- the second color conversion layer comprises second quantum dots.

14. The display apparatus of claim 1, wherein the plurality of light-emitting devices are organic light-emitting diodes emitting blue light.

15. A display apparatus comprising:
- a first substrate and a second substrate facing the first substrate;
- a light-emitting device disposed on the first substrate and comprising an emission area;
- a pixel-defining layer disposed on the first substrate and defining the emission area;
- an encapsulation layer covering the light-emitting device;
- a bank disposed above the encapsulation layer and having a plurality of openings corresponding to the emission area;
- a first protrusion pattern arranged between the bank and the encapsulation layer;
- a second protrusion pattern arranged between the bank and the encapsulation layer and having a thickness greater than a thickness of the first protrusion pattern in a thickness direction of the second substrate;
- a functional layer arranged in the plurality of openings; and
- a color filter layer arranged between the functional layer and the second substrate, and between the bank and the second substrate,
- wherein the second protrusion pattern and the bank comprise a same material,
- wherein the plurality of openings comprise a plurality of first openings and a plurality of second openings,
- the functional layer is arranged in the plurality of first openings, and
- the first protrusion pattern is arranged between adjacent ones of the plurality of first openings.

16. The display apparatus of claim 15, wherein each of the first protrusion pattern and the second protrusion pattern overlaps the bank and the pixel-defining layer in a plan view.

17. The display apparatus of claim 15, wherein the bank and the second protrusion pattern are integral with each other.

18. The display apparatus of claim 15, wherein the first protrusion pattern is spaced apart from the second protrusion pattern.

* * * * *